(12) United States Patent
Deguenther et al.

(10) Patent No.: US 9,977,334 B2
(45) Date of Patent: May 22, 2018

(54) LIGHTING SYSTEM OF A MICROLITHOGRAPHIC PROJECTION EXPOSURE SYSTEM AND METHOD FOR OPERATING SUCH A LIGHTING SYSTEM

(71) Applicant: Carl Zeiss SMT GmbH, Oberkochen (DE)

(72) Inventors: Markus Deguenther, Aalen (DE); Vladimir Davydenko, Bad Herrenalb (DE); Thomas Korb, Schwaebisch Gmuend (DE); Johannes Eisenmenger, Ulm (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days. days.

(21) Appl. No.: 15/224,954

(22) Filed: Aug. 1, 2016

(65) Prior Publication Data

US 2016/0357113 A1 Dec. 8, 2016

Related U.S. Application Data

(63) Continuation of application No. PCT/EP2015/000222, filed on Feb. 5, 2015.

(30) Foreign Application Priority Data

Feb. 19, 2014 (DE) .................... 10 2014 203 040

(51) Int. Cl.
*G03B 27/54* (2006.01)
*G03F 7/20* (2006.01)
*G02B 26/08* (2006.01)

(52) U.S. Cl.
CPC .......... *G03F 7/702* (2013.01); *G03F 7/70041* (2013.01); *G03F 7/70116* (2013.01); *G03F 7/70475* (2013.01); *G02B 26/0833* (2013.01)

(58) Field of Classification Search
CPC ............. G03F 7/70041; G03F 7/70475; G03F 7/70116
USPC ................................................ 355/53, 67–71
See application file for complete search history.

(56) References Cited

U.S. PATENT DOCUMENTS

| | | |
|---|---|---|
| 6,624,880 B2 | 9/2003 | Sandstroem et al. |
| 6,737,662 B2 | 5/2004 | Mulder et al. |
| 7,061,582 B2 | 6/2006 | Zinn et al. |
| 7,180,575 B2 | 2/2007 | Kasumi et al. |

(Continued)

FOREIGN PATENT DOCUMENTS

| | | |
|---|---|---|
| DE | 10 2010 001388 A1 | 8/2011 |
| EP | 1 262 836 A1 | 12/2002 |

(Continued)

OTHER PUBLICATIONS

European patent application No. 13194135.3, entitled "Illumination System of a Microlithgraphic Projection Exposure Apparatus", filed Nov. 22, 2013.

(Continued)

*Primary Examiner* — Hung Henry Nguyen
(74) *Attorney, Agent, or Firm* — Fish & Richardson P.C.

(57) ABSTRACT

An illumination system of a microlithographic projection exposure apparatus includes a light source operated in a pulsed manner and a DMD (digital mirror device) or another array of optical elements, which are digitally switchable between two switching positions.

17 Claims, 3 Drawing Sheets

(56) References Cited

U.S. PATENT DOCUMENTS

| | | | |
|---|---|---|---|
| 7,209,217 B2 | 4/2007 | Troost | |
| 7,957,055 B2 | 6/2011 | Sandstroem et al. | |
| 9,310,697 B2* | 4/2016 | Yun .................... | G03F 7/70275 |
| 2006/0087634 A1 | 4/2006 | Brown et al. | |
| 2006/0147841 A1* | 7/2006 | Ohmi .................. | G03F 7/70291 |
| | | | 430/311 |
| 2010/0060873 A1 | 3/2010 | Deguenther et al. | |
| 2010/0277708 A1* | 11/2010 | Fiolka ................. | G03F 7/70208 |
| | | | 355/71 |
| 2011/0134407 A1 | 6/2011 | Sung | |
| 2011/0240611 A1 | 10/2011 | Sandstroem | |
| 2012/0081685 A1 | 4/2012 | Kohl | |
| 2012/0287414 A1 | 11/2012 | Fiolica et al. | |
| 2015/0146184 A1 | 5/2015 | Deguenther et al. | |

FOREIGN PATENT DOCUMENTS

| | | |
|---|---|---|
| JP | 2003-022967 | 1/2003 |
| JP | 2006-128194 | 5/2006 |
| JP | 2006-295167 | 10/2006 |
| WO | WO 2005/026843 A2 | 3/2005 |
| WO | WO 2010/006687 A1 | 1/2010 |
| WO | WO 2012/100791 | 8/2012 |

OTHER PUBLICATIONS

Translation of the International Search Report for corresponding PCT Appl No. PCT/EP2015/000222, dated Jun. 19, 2015.
Japanese Office Action with English translation thereof for corresponding JP Application No. 2016-553429, dated Aug. 10, 2017, 9 pages.

* cited by examiner

LIGHTING SYSTEM OF A MICROLITHOGRAPHIC PROJECTION EXPOSURE SYSTEM AND METHOD FOR OPERATING SUCH A LIGHTING SYSTEM

CROSS-REFERENCE TO RELATED APPLICATIONS

The present application is a continuation of, and claims benefit under 35 USC 120 to, international application PCT/EP2015/000222, filed Feb. 5, 2015, which claims benefit under 35 USC 119 of German Application No. 10 2014 203 040.4, filed Feb. 19, 2014. The entire disclosures of international application PCT/EP2015/000222 and German Application No. 10 2014 203 040.4 are incorporated by reference herein.

FIELD

The disclosure relates to an illumination system of a microlithographic projection exposure apparatus, which includes a light source operated in a pulsed manner and a DMD (digital mirror device) or another array of optical elements, which are digitally switchable between two switching positions.

BACKGROUND

Integrated electrical circuits and other microstructured components are usually produced by virtue of a plurality of structured layers being applied onto a suitable substrate, which is usually a silicon wafer. For the purposes of structuring the layers, these are initially covered by a photoresist (resist), which is sensitive to light from a specific wavelength range, e.g. light in the deep ultraviolet (DUV), vacuum ultraviolet (VUV) or extreme ultraviolet (EUV) spectral range. Subsequently, the wafer thus coated is exposed in a projection exposure apparatus. Here, a pattern of diffractive structures, which is arranged on a mask, is imaged onto the photoresist with the aid of a projection lens. Since the absolute value of the imaging scale generally is less than 1 in this case, such projection lenses are sometimes also referred to as reduction lenses.

The wafer is subjected to an etching process after developing the photoresist, as a result of which the layer is structured in accordance with the pattern on the mask. The photoresist which still remained is then removed from the remaining parts of the layer. This process is repeated until all layers are applied to the wafer.

References disclose illumination systems which use mirror arrays in order to be able to variably illuminate the pupil plane of the illumination system. Examples are found in EP 1 262 836 A1, US 2006/0087634 A1, U.S. Pat. No. 7,061,582 B2, WO 2005/026843 A2 and WO 2010/006687 A1. In general, these are mirror arrays in which the mirrors can be tilted continuously over a certain angle range.

WO 2012/100791 A1 disclosesan illumination system which additionally includes a digitally switchable micromirror array. This micromirror array is imaged onto the light-entrance facets of an optical integrator with the aid of a lens. A similar illumination system, albeit with a different actuation, is known from the European patent application, filed on Nov. 22, 2013, with the file reference EP 13194135.3 and the title "*Illumination System of a Microlithgraphic Projection Exposure Apparatus*", the contents of which is hereby incorporated by reference.

When digitally switchable micromirror arrays are used in illumination systems, the number of micromirrors involved is generally so high that it cannot be provided by a single micromechanical component. It is for this reason that the previously mentioned European patent application with the file reference EP 13194135.3 has proposed arranging a plurality of relatively small micromirror arrays next to one another on a carrier and imaging these onto the target surface with the aid of a special imaging optical unit in such a way that the images of the individual arrays adjoin one another seamlessly on the target surface.

Similar problems arise if the array in the illumination system does not contain any micromirrors but optical elements which are switchable in a different manner, e.g. liquid crystal cells, as are used in LCDs.

A further problem when using arrays with switchable optical elements consists of the fact that, occasionally, the optical elements are spaced relatively far apart. If such an array is imaged onto the target surface, correspondingly large gaps arise between the images of the optical elements, which is often undesirable.

U.S. Pat. No. 6,624,880 B2, US 2011/0134407 A1 and U.S. Pat. No. 7,957,055 B2 disclose projection exposure apparatuses, in which an illumination system does not illuminate any conventional masks but a micromirror array which assumes the function of the mask. Such apparatuses are often also referred to as "mask-less". US 2011/0240611 A1 describes a projection exposure apparatus, in which a one-dimensional micromirror array is used to directly ablate material on the wafer. US 2012/0081685 A1 has disclosed an illumination system in which the polarization direction of the light can be switched over between two successive light pulses.

SUMMARY

The disclosure seeks to provide an illumination system of a microlithographic projection exposure apparatus, by which a relatively large target surface can be uniformly illuminated in a particularly simple manner with the aid of an array of optical elements, which are digitally switchable between two switching positions.

In one aspect the disclosure provides an illumination system of a microlithographic projection exposure apparatus which has a light source that is configured to generate a sequence (in particular a periodic sequence) of light pulses. An array of optical elements is arranged in the light path between the light source and a target surface. The optical elements are digitally switchable between two switching positions. An adjustable light-deflection optical unit is arranged in the light path between the array and the target surface. The light deflection optical unit is configured to deflect incident light with different deflection angles. A control device is configured to actuate the light-deflection optical unit so that there is a change in the deflection angles between two successive light pulses.

Therefore, in one aspect according to the disclosure, the target surface is never illuminated completely at a given time, but only in part. The relatively long times between successive light pulses are used to adjust the light-deflection optical unit and, when desired, also to switch over the optical elements of the array into a different switching position. In this manner, the desired light distribution on the target surface is built up successively, in a manner similar to time multiplexing. The overall intensity distribution then arises by integration over time. By switching over at least one of the optical elements of the array between two successive light pulses, it is possible to generate a different light pattern on each illuminated region in the target surface.

In illumination systems, such a successive build-up of an intensity distribution on a target surface is generally tolerable since the photoresist likewise integrates the intensity incident thereon. The photoresist only changes its chemical properties once the intensity integrated over the whole exposure (which is sometimes also referred to as dose) exceeds a specific threshold.

Thus, the illumination angle distribution in the mask plane (and hence also in the image planes of the projection lens optically conjugate thereto) is predetermined in an illumination system by the time-integrated spatial distribution of the projection light in the pupil surface. If the target surface illuminated by the array is the pupil surface or a surface conjugate thereto, or at least determines the illumination thereof, the successive illumination of the pupil surface according to the disclosure can successively assemble the illumination angle distribution from a plurality of individual distributions during the exposure.

The adjustable light-deflection optical unit can be any optical element with which incident light can be deflected in different directions. In particular, reflecting optical elements, such as tiltable plane mirrors or rotating polygon mirrors, or else refractive optical elements, such as e.g. tiltable or rotating wedge elements, come into consideration.

In one exemplary embodiment, the light-deflection optical unit and the control device are configured so that a first light pattern which is illuminable on the target surface by the array prior to a change in the deflection angles does not overlap with a second light pattern which is illuminable on the target surface by the array after the change in the deflection angles. This ensures that a maximum target surface can be passed over by the successive illumination of the light field with a predetermined number of light pulses. In this context, a light pattern is understood to be the set of all illuminated regions; the dark regions remaining between the illuminated regions are therefore not part of the light pattern.

What comes into consideration here is to arrange the first light pattern and the second light pattern on the target field in such a way that envelopes (i.e. external contours) of the two light patterns do not overlap. Using this, the two light patterns can be e.g. arranged in a row next to one another or in a two-dimensional arrangement in a predetermined grid on the target surface. In this manner, it is possible also to illuminate relatively large target surfaces very quickly via the array. Such control of the light-deflection optical unit and the optical elements of the array lends itself in particular if unavoidable gaps between the optical elements are not transferred onto the target surface or are so small that they can be tolerated.

By contrast, if such gaps are intolerably large, it is often more expedient to entangle the first light pattern and the second light pattern in one another. The light-deflection optical unit then displaces the light patterns between the two light pulses preferably only slightly such that the envelopes of the light patterns overlap significantly. If the light patterns themselves also overlap, it is possible to illuminate practically any intensity distribution (also multi-stage intensity distributions) on the target surface by the array after temporal integration.

This is particularly expedient if the distance between two adjacent optical elements of the array along a reference direction is greater than the maximum dimension of the two optical elements along the reference direction. The first light pattern and the second light pattern can then be entangled in one another in such a way that the second light pattern illuminates gaps on the target surface which cannot be illuminated by the first light pattern. Such gaps may arise, in particular, if a lens which images the array onto the target surface is arranged in the light path between the array and the target surface.

The light source can be a laser which is configured for generating projection light with a center wavelength of 150 nm and 250 nm.

The subject matter of the disclosure is moreover a method for operating an illumination system of a microlithographic projection exposure apparatus, including the following steps:

a) directing a sequence of light pulses onto an array of optical elements which are digitally switchable between two switching positions, wherein the array illuminates a target surface; and b) deflecting the light directed from the array to the target surface by different deflection angles via an adjustable light-deflection optical unit arranged in the light path between the array and the target surface, wherein a change in the deflection angles occurs between two successive light pulses.

The advantages of the method according to the disclosure substantially correspond to those which were already explained above with reference to the illumination system according to the disclosure.

At least one of the optical elements of the array can switch over between two light pulses. As a result, very different intensity distributions can be generated on the target surface after temporal integration.

A first light pattern which is illuminated on the target surface by the array prior to a change in the deflection angles preferably does not overlap with a second light pattern which is illuminated on the target surface by the array after the change in the deflection angles.

The first light pattern and the second light pattern can be arranged on the target field in such a way that envelopes of the two light patterns do not overlap.

As an alternative thereto, the first light pattern and the second light pattern can be entangled in one another. This is particularly expedient when the distance between adjacent optical elements of the array along a reference direction is greater than the maximum dimension of an optical element along the reference direction.

BRIEF DESCRIPTION OF THE DRAWINGS

Further features and advantages of the disclosure will become apparent from the following description of exemplary embodiments with reference to the drawings, in which.

DESCRIPTION OF THE PREFERRED EMBODIMENTS

Figure 1:
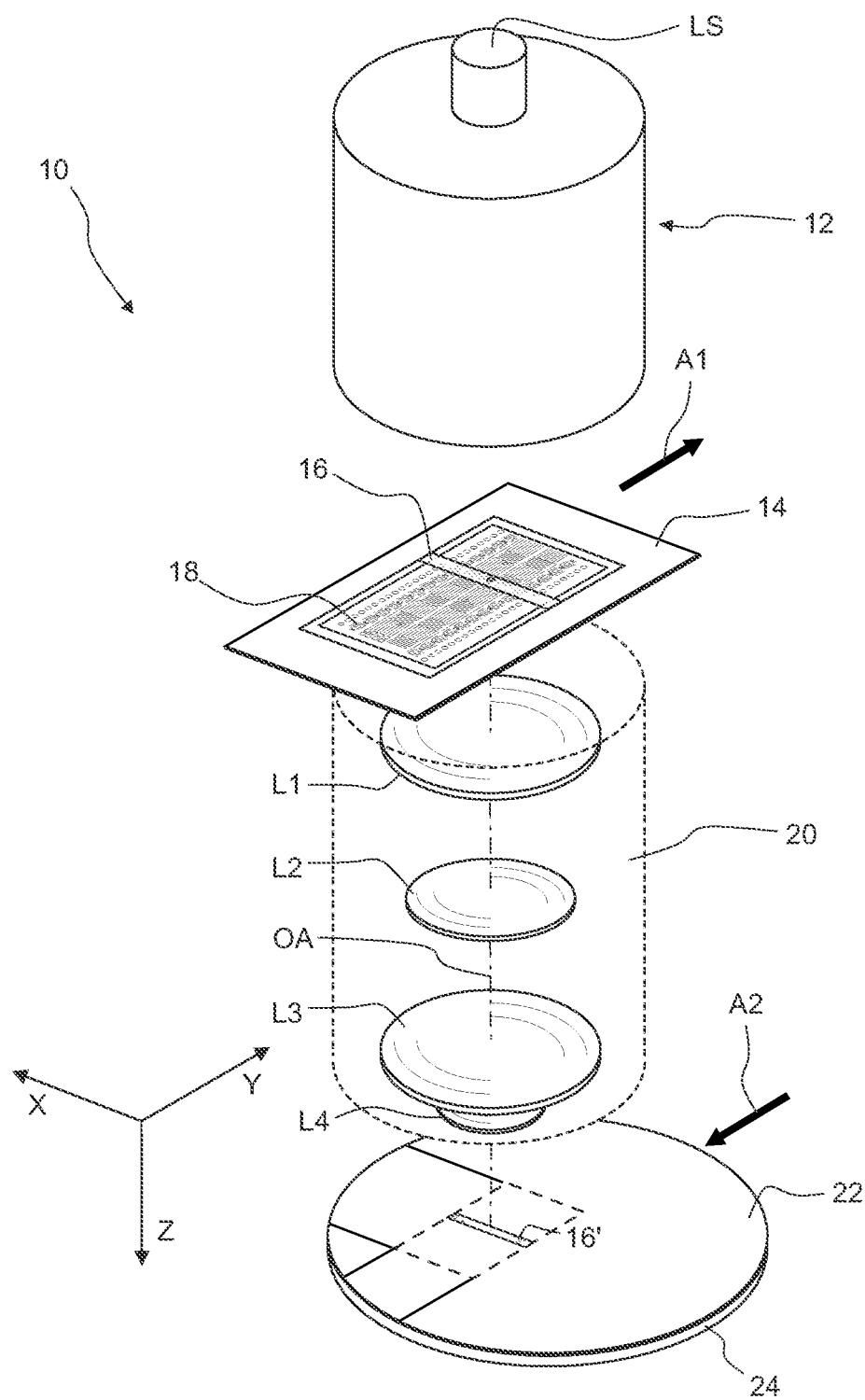
FIG. 1 shows a much simplified perspective illustration of a microlithographic projection exposure apparatus.

FIG. 1 shows a projection exposure apparatus 10 in a very schematic perspective illustration, the projection exposure apparatus being suitable for the lithographic production of microstructured components. The projection exposure apparatus 10 contains a light source LS, which is configured to generate projection light with a center wavelength of 193 nm, and an illumination system 12, which directs the projection light generated by the light source LS onto a mask 14 and illuminates a narrow illumination field 16, which is rectangular in the depicted exemplary embodiment, there. Other illumination field forms, e.g. ring segments, likewise come into consideration.

Structures 18 on the mask 14 lying within the illumination field 16 are imaged on a light-sensitive layer 22 with the aid of a projection lens 20, which contains a plurality of lens elements L1 to L4. The light-sensitive layer 22, which may be e.g. a photoresist, is applied to a wafer 24 or another suitable substrate and is situated in the image plane of the projection lens 20. Since the projection lens 20 generally has an imaging scale $|\beta|<1$, the structures 18 lying within the illumination field 16 are imaged with reduced size on a projection field 18'.

In the depicted projection exposure apparatus 10, the mask 14 and the wafer 24 are displaced along a direction denoted by Y during the projection. The ratio of the displacement speeds in this case equals the imaging scale $\beta$ of the projection lens 20. If the projection lens 20 inverts the image (i.e. $\beta<0$), the displacement movements of the mask 14 and of the wafer 24 extend counter to one another, as indicated in FIG. 1 by arrows A1 and A2. In this manner, the illumination field 16 is guided with a scanning movement over the mask 14 such that even relatively large structured regions can be projected contiguously on the light-sensitive layer 22.

Figure 2A:
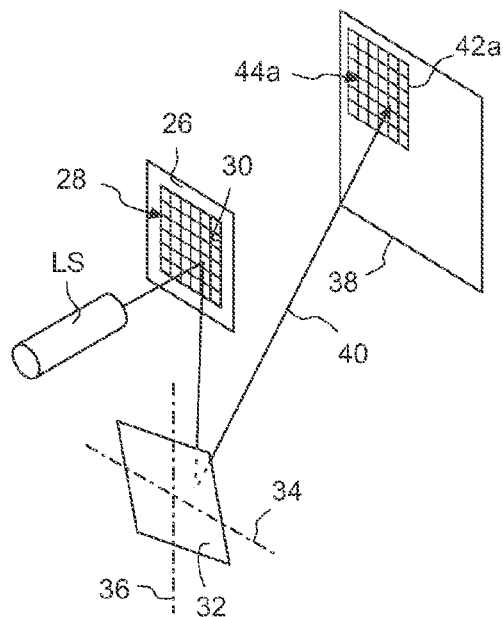
FIGS. 2a to 2d show parts of an illumination system according to the disclosure in a schematic perspective illustration at different times during a scanning process.
Figure 2C:
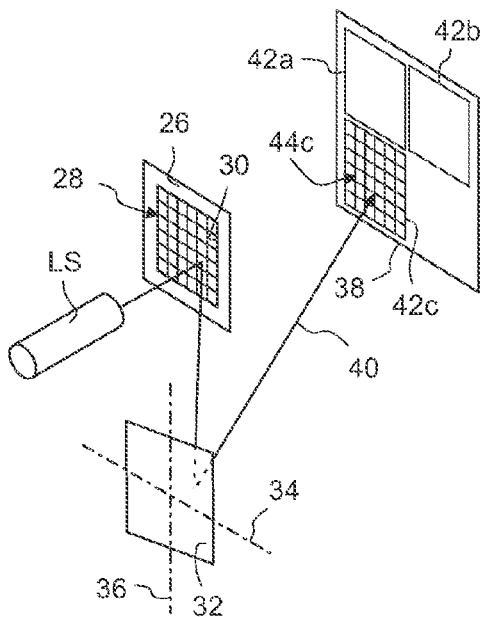

FIG. 2a shows parts of the illumination system 12 in a schematic perspective illustration. A micromirror array 28, which contains a multiplicity of micromirrors 30, is arranged on a carrier 26. Each micromirror 30 is digitally switchable between two switching positions. The micromirrors 30 are in this case distributed in a regular two-dimensional arrangement over the surface of the micromirror array 28.

In particular, the micromirror array 28 can be a digital mirror device (DMD), which is usually realized as a microelectromechanical system (MEMS) component.

Arranged downstream of the micromirror array 28 in the light path is a tilt mirror 32, which is tiltable about two orthogonal tilt axes 34, 36 via actuators (not depicted here). The tilt mirror 32 is situated in the optical light path between the micromirror array 28 and a target surface 38, which may be e.g. the light-entrance facets of an optical integrator or a pupil surface of the illumination system 12.

The tilt mirror 32 is shown in a first tilt position in FIG. 2a. In this first tilt position, the projection light 40 reflected by the micromirror array 28 is directed onto the target surface 38 in such a way that a light pattern 44a arises there in a first region 42a. Here, the light pattern 44a depends on the position of the micromirrors 30 in the micromirror array 28. Therefore, the light pattern 44a can be modified in the first region 42a by suitable actuation of the micromirrors 30. As more micromirrors 30 are contained in the micromirror array 28, the spatial resolution, with which the light pattern 44a can be set, increases.

When operating the projection exposure apparatus, the light pattern 44a is generated in the first region 42a during one or more successive light pulses which are emitted by the light source LS. Here, the light pulses are typically emitted by the light source LS with a frequency of a few kHz, with the duration t of the light pulses being short in relation to the period T ($t/T\ll1$). The time intervals between the light pulses, during which no projection light 40 passes through the illumination system 12, are correspondingly long.

Figure 2B:
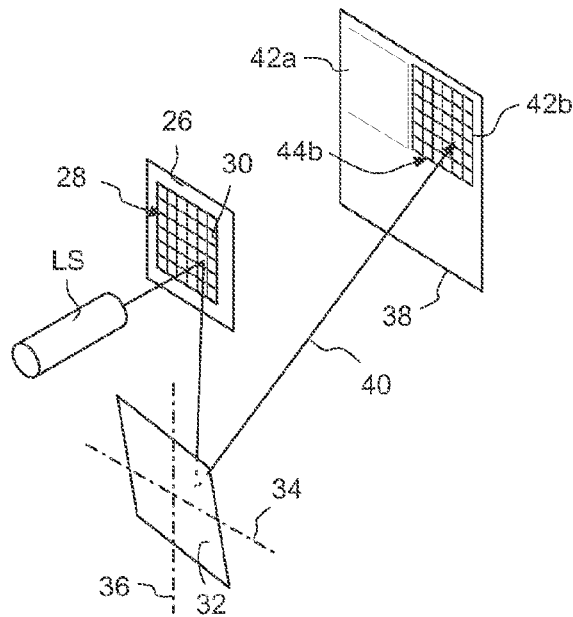
Figure 2D:
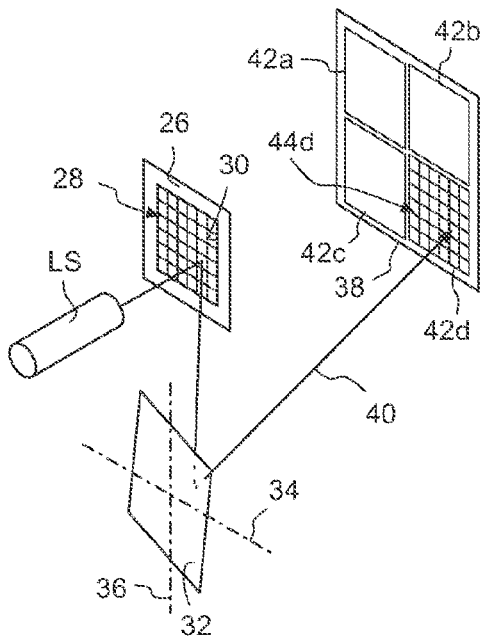

According to the disclosure, these long time intervals between the light pulses are used for tilting the tilt mirror 32 by one or both tilt axes 34, 36 and therefore transferring the tilt mirror into a second tilt position. In this way, a second region 42b is illuminated when the next light pulse is on the target surface 38, as illustrated by FIG. 2b. Moreover, at least one micromirror 30 of the micromirror array 28 can be switched over in the time interval between two successive light pulses. The light pattern 44b generated on the second region 42b will therefore generally differ from the light pattern 44a with which the target surface 38 was previously illuminated in the first region 42a. The two regions 42a, 42b in this case are preferably directly adjacent to one another such that the light patterns 44a, 44b on the target surface 38 also merge into one another in an at least substantially seamless manner.

After the second light pattern 44b has been generated on the target surface 38 during one or more light pulses, the tilt mirror 32 is once again tilted about at least one of the tilt axes 34, 36 with the aid of the actuators during another time interval between two successive light pulses and the mirror is therefore transferred into a third tilt position. As a result, during the next light pulse, a third region 42c on the target surface 38 is illuminated with a third light pattern 44c by the projection light 40 reflected by the micromirror array 28. If the third light pattern 44c is intended to differ from the second light pattern 44b, the micromirrors 30 of the micromirror array 28 are at least partly also switched over at the same time.

In the illustrated exemplary embodiment, such an adjustment of the tilt mirror 32 and of the micromirrors 30 repeats again in order to generate a fourth light pattern 44d in a fourth region 42d in the target surface 30.

The target surface 38 was therefore completely covered by light patterns 44a to 44d over a time period of at least four light pulses after adjustments of the tilt mirror 32 during the time intervals between two respectively successive light pulses. Therefore, a value for the resolution of the light pattern over the whole target surface 38 emerges after temporal integration, the value corresponding to four times the resolution which can be generated by the micromirror array 28 on the target surface 38 at a given time.

If a plurality of light pulses illuminate one of the regions 42a to 42d, there moreover is the option of switching over only the micromirrors 30, but not the tilt mirror 32, during the time intervals between these successive light pulses. In this manner, it is possible to generate different intensity gradations after temporal integration within the regions 42a to 42d. If a total of 40 light pulses are available during the exposure of the light-sensitive layer 22, these 40 light pulses can be distributed uniformly over the four regions 42a to 42d. Then, 10 light pulses are available for each region 42a to 42d, which corresponds to a gradation of 10 different light intensities within each region 42a to 42d. As a result, relatively large contiguous and multiply graduated intensity distributions can be generated on the target surface 38 via a simple and relatively small digital micromirror array 28. This enables not only the precise setting of different illumination angle distributions but also the generation of field-dependent illumination angle distributions, as described in the European patent application with the file reference EP 13194135.3, already mentioned at the outset. Here, the resolution of the light pattern on the optical integrator is so high that different light patterns can be generated on the small light-entrance facets of the optical integrator. Since these light patterns are imaged directly onto the mask, it is therefore also possible to generate field-dependent illumination angle distributions and influence the dimensions of the illumination field 16 by way of the actuation of the micromirror array 28.

Figure 3:
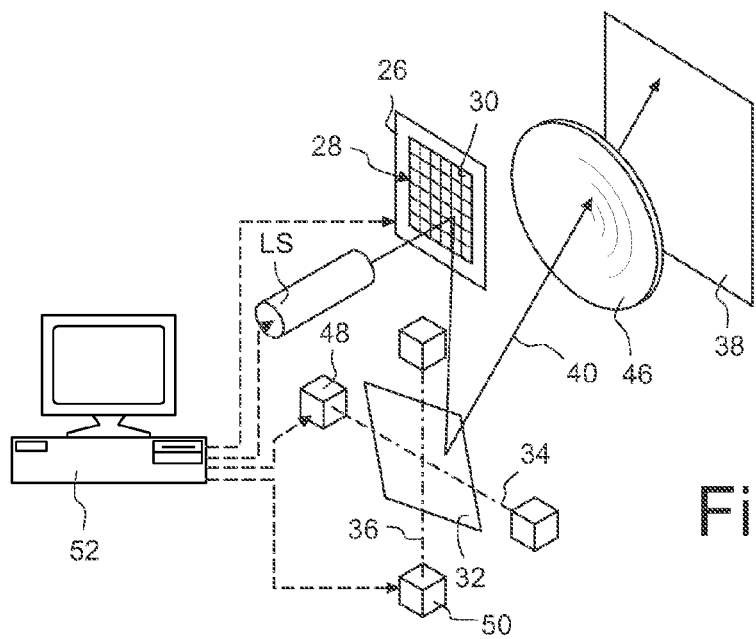
FIG. 3 shows part of an illumination system according to the disclosure in accordance with another exemplary embodiment in an illustration based on FIGS. 2a to 2d, in which a micromirror array is imaged onto the target surface by a lens.

FIG. 3 shows another exemplary embodiment for an illumination system according to the disclosure in a schematic perspective illustration based on FIGS. 2a to 2d, in which a lens 46 indicated as an individual lens element is arranged in the light path between the micromirror array 28 and the target surface 38. The lens 46 images the micromirror array 28 onto the target surface 38.

Furthermore, actuators 48, 50 for the tilt mirror 32 and a control device 52 are depicted in FIG. 3. The control device 50 actuates the light source LS, the actuators 48, 50 and the micromirror array 28 and therefore ensures the desired synchronization between the light pulses generated by the light source LS on the one hand and the adjustment processes of the tilt mirror 32 and of the micromirrors 30.

Figure 4:
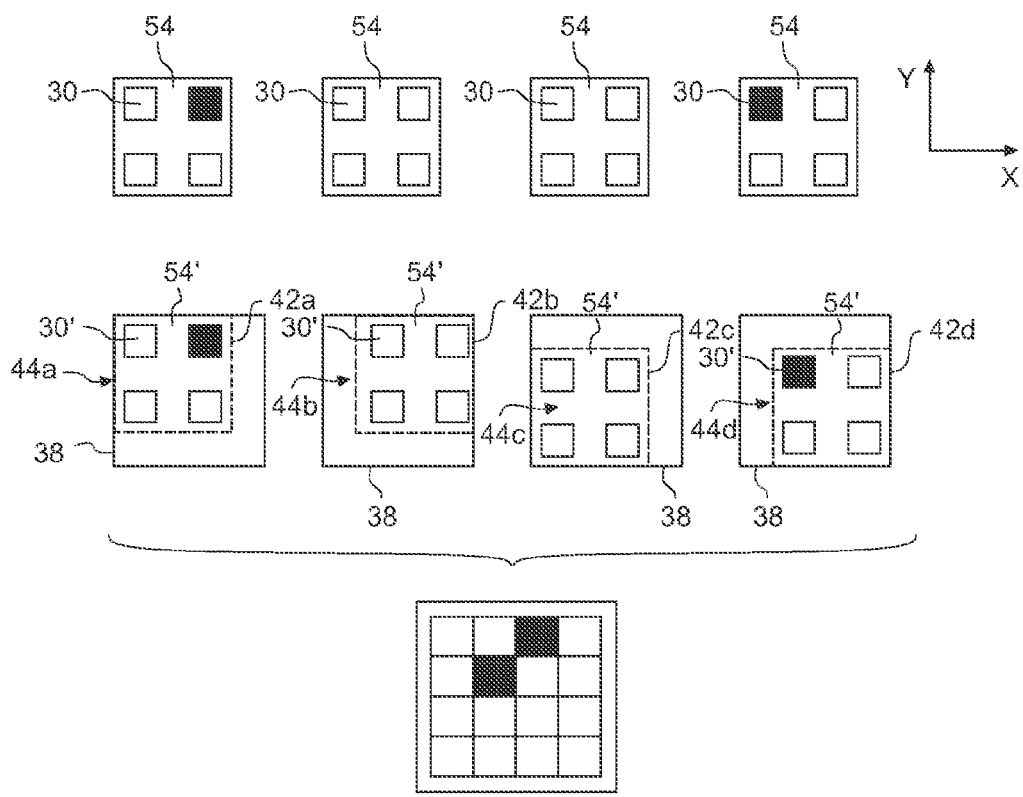
FIG. 4 shows a schematic illustration for explaining an exemplary embodiment, in which the light patterns generated in succession on a mirror surface by the micromirror array are entangled in one another.

With the aid of the arrangement shown in FIG. 3, it is also possible to realize an actuation in which the light patterns on the target surface are entangled in one another, as illustrated in FIG. 4. FIG. 4 shows, at the top, four light distributions on the micromirror array 28 at four different times; for reasons of clarity, it was suggested here that the micromirror array 28 only has 4 micromirrors 30. It is possible to see that the micromirrors 30 are separated from one another by relatively large non-reflecting regions 54. In this exemplary embodiment, the dimensions of the micromirrors 30 along one reference direction, e.g. the X-direction, are not greater than the distances between adjacent micromirrors 30 along this reference direction.

As illustrated by FIG. 4 in the center, the actuators 48, 50 for the tilt mirror 32 are actuated by the control device 52 in such a way in this exemplary embodiment that the light patterns 44a to 44d are entangled in one another. The regions 42a to 42d, which are illuminated on the target surface 38 depending on the adjustment of the tilt mirror 32, are in this case only offset from one another by the width of the image 30' of a micromirror 30, as a result of which the envelopes of the regions 42a to 42d significantly overlap in each case. As a result of successive pivoting of the regions 42a to 42d, the target surface 38 is completely illuminated after temporal integration, as is indicated at the bottom of FIG. 4.

The micromirrors 30, which are tilted into the "off position" and therefore indicated using black, in the light patterns 44a and 44d adjoin one another with their corners in the temporally integrated intensity distribution, as indicated in the bottom of FIG. 4. Consequently, what can be achieved by pivoting the light patterns with the aid of the tilt mirror 32 is that it is possible even in the case of imaging of the micromirror array 28 to generate an intensity distribution on the target surface 38 with the aid of the lens 46, which intensity distribution is free from images of the nonreflecting regions 54.

What is claimed is:

1. A system, comprising:
a light source configured to generate a sequence of light pulses;
an array of optical elements in a light path between the light source and a target surface, the optical elements being digitally switchable between two switching positions;
an adjustable light-deflection optical unit arranged in the light path between the array and the target surface, the light-deflection optical unit being configured to deflect incident light with different deflection angles; and
a control device configured to actuate the light-deflection optical unit to change deflection angles between two successive light pulses,
wherein the system is an illumination system, and
wherein the light-deflection optical unit and the control device are configured so that a first light pattern, which is illuminable on the target surface via the array prior to a change in the deflection angles, does not overlap with a second light pattern, which is illuminable on the target surface by the array after a change in the deflection angles.

2. The system of claim 1, wherein the control device is configured to switch over at least one of the optical elements of the array between two light pulses.

3. The system of claim 1, wherein the first and second light patterns are arranged on the target field so that envelopes of the first and second light patterns do not overlap.

4. The system of claim 1, wherein the first and second light patterns are entangled in one another.

5. The system of claim 4, wherein the distance between two adjacent optical elements of the array along a reference direction is greater than a maximum dimension of the two optical elements along the reference direction.

6. The system of claim 1, further comprising a lens in the light path between the array and the target surface, wherein the lens is configured to image the array onto the target surface.

7. An apparatus comprising:
an illumination system according to claim 1; and
a projection lens,
wherein the apparatus is a projection exposure apparatus.

8. A method of operating a projection exposure apparatus comprising an illumination system and a projection lens, the method comprising:
using the illumination system to illuminate patterns of a mask; and
using the projection lens to project the illuminated patterns of the mask onto light-sensitive material,
wherein the illumination system is an illumination system according to claim 1.

9. A system, comprising:
an array of optical elements upstream of a target surface along a path of light pulses, the optical elements being digitally switchable between two switching positions;
an adjustable light-deflection optical unit arranged in the path of the light pulses between the array and the target surface, the light-deflection optical unit being configured to deflect incident light with different deflection angles; and
a control device configured to actuate the light-deflection optical unit to change deflection angles between two successive light pulses,
wherein the system is an illumination system, and
wherein the light-deflection optical unit and the control device are configured in such so that during use of the illumination system a first light pattern, which is illuminable on the target surface via the array prior to a change in the deflection angles, does not overlap with a second light pattern, which is illuminable on the target surface by the array after a change in the deflection angles.

10. The system of claim 9, wherein the control device is configured to switch over at least one of the optical elements of the array between two light pulses.

11. An apparatus comprising:
an illumination system according to claim 9; and
a projection lens,
wherein the apparatus is a projection exposure apparatus.

12. A method of operating a projection exposure apparatus comprising an illumination system and a projection lens, the method comprising:
    using the illumination system to illuminate patterns of a mask; and
    using the projection lens to project the illuminated patterns of the mask onto light-sensitive material,
    wherein the illumination system is an illumination system according to claim 9.

13. A method for operating an illumination system, the method comprising:
    directing a sequence of light pulses onto an array of optical elements which are digitally switchable between two switching positions, wherein the array illuminates a target surface; and
    deflecting the light directed from the array to the target surface by different deflection angles via an adjustable light-deflection optical unit arranged in the light path between the array and the target surface, wherein a change in the deflection angles occurs between two successive light pulses,
    wherein a first light pattern, which is illuminable on the target surface via the array prior to a change in the deflection angles, does not overlap with a second light pattern, which is illuminable on the target surface via the array after a change in the deflection angles.

14. The method of claim 13, wherein at least one of the optical elements of the array switches over between two light pulses.

15. The method of claim 13, wherein the first and second light patterns are arranged on the target field so that envelopes of the two light patterns do not overlap.

16. The method of claim 13, wherein the first and second light patterns are entangled in one another.

17. The method of claim 16, wherein a distance between adjacent optical elements of the array along a reference direction is greater than a maximum dimension of an optical element along the reference direction.

* * * * *

UNITED STATES PATENT AND TRADEMARK OFFICE
CERTIFICATE OF CORRECTION

PATENT NO. : 9,977,334 B2
APPLICATION NO. : 15/224954
DATED : May 22, 2018
INVENTOR(S) : Markus Deguenther et al.

It is certified that error appears in the above-identified patent and that said Letters Patent is hereby corrected as shown below:

On the Title Page

Column 1, (Notice), Line 3, replace "days. days" with "days.";

In the Specification

Column 1, Line 58, delete "disclosesan" insert -- discloses an --;

Column 1, Line 65, delete "Microlithgraphic" insert -- Microlithographic --.

Signed and Sealed this
Twenty-third Day of April, 2019

Andrei Iancu
*Director of the United States Patent and Trademark Office*